United States Patent
Mutoh

(10) Patent No.: US 6,379,057 B1
(45) Date of Patent: Apr. 30, 2002

(54) RESIST DEVELOPING PROCESS

(75) Inventor: Akira Mutoh, Tokyo (JP)

(73) Assignee: NEC Corporation, Tokyo (JP)

( * ) Notice: Subject to any disclaimer, the term of this patent is extended or adjusted under 35 U.S.C. 154(b) by 76 days.

(21) Appl. No.: 09/733,379

(22) Filed: Jun. 2, 2000

Related U.S. Application Data

(62) Division of application No. 09/127,763, filed on Jul. 31, 1998, now Pat. No. 6,207,352.

(30) Foreign Application Priority Data

Jul. 31, 1997 (JP) .............................................. 9-220622

(51) Int. Cl.$^7$ ................................................ G03D 5/00
(52) U.S. Cl. ........................ 396/611; 430/311; 430/325
(58) Field of Search ................................ 396/604, 611, 396/627, 578; 430/311, 325, 331; 118/52, 319–321, 666–670

(56) References Cited

U.S. PATENT DOCUMENTS

| | | | |
|---|---|---|---|
| 3,617,131 A | * 11/1971 | Taguchi | ................... 356/139.1 |
| 5,342,738 A | 8/1994 | Ikeda | |
| 5,454,170 A | * 10/1995 | Cook | ........................... 33/645 |
| 5,853,961 A | * 12/1998 | Sakai et al. | ................... 134/10 |
| 5,897,982 A | 4/1999 | Shibata et al. | |
| 6,248,989 B1 | * 6/2001 | Ohishi | ........................ 250/205 |

FOREIGN PATENT DOCUMENTS

JP          63-43427          3/1988

* cited by examiner

*Primary Examiner*—D Rutledge
(74) *Attorney, Agent, or Firm*—Foley & Lardner

(57) ABSTRACT

A developing process for obtaining a resist pattern on a semiconductor wafer includes puddling a developer on a wafer and holding a wafer inclined at a predetermined tilt angle in the puddled condition and repeating alternately stoppage and slow rotation plural times. This can make the central pattern width narrower selectively simply by apparatus adjustment, in case where, otherwise the pattern width of a wafer's central portion becomes wide, thereby achieving an increased pattern uniformity of the wafer and serve as improving the performances.

9 Claims, 8 Drawing Sheets

· Lowest position

Flow of a developer

New lowest position

Lowest position

New lowest position

Embedded leveling instrument

—12

18
19: Scale
20: Bubble for reading an inclination

Wafer of 8 inches are used
Measured direction

RESIST DEVELOPING PROCESS

This application is a division of U.S. patent application Ser. No. 09/127,763, filed Jul. 31, 1998 now U.S. Pat. No. 6,207,352.

FIELD OF THE INVENTION

The present invention relates to a photoresist (termed herein as "resist") developing process, more especially to a developing process for preparing a resist pattern on a wafer by applying a puddling method in a process for preparing a semiconductor.

BACKGROUND

In a process for preparing a semiconductor, forming a resist pattern on a wafer is now put into practice by using, for example, an apparatus shown in FIG. 8. In FIG. 8. "11" denotes a wafer; "12", a chuck for holding a wafer by absorption; "13", a shaft of a chuck; "14", a motor for rotating a shaft of a chuck; "15", a supporting plate and "16", a connecting part of an apparatus. As to the apparatus shown in FIG. 8, refer to microfilmed Japanese Utility Model Registration Application No. 61-135016 (1986) (Utility Model Kokai Publication JP-U-A-63-43427 (1988)), particularly its conventional art (FIG. 2).

At the outset, a resist is coated on a wafer and then exposed with an exposing apparatus. The resultant wafer 11 is held on a wafer chuck 12 and then rotated at a most appropriate number of rotation for equalizing the dimension of a pattern developed on the surface of the wafer without causing defects upon developing, and a developer is dropped by applying a spraying method or the like. After dropping, a paddle state of the developer cast up on the wafer to have a liquid thickness of about 2 mm is formed in order to progress developing without fault by maintaining the developer cast up on the wafer for a predetermined time, e.g., for about 60 seconds. Subsequently, the developer is splashed away from the wafer by high speed rotation followed by washing away with pure water and then the wafer is subjected to be dried while rotating.

Alternative to the rotary chuck with a stationary, straight axis of rotation, JP-U-A-63-43427, proposed a method wherein the chuck is rotated at a low speed while tiltedly swinging its rotational axis for distributing the developer and proceeding the developing.

SUMMARY OF THE DISCLOSURE

In proportion to minimizing a pattern or enlarging the size of a wafer, the process margin for preparing a semiconductor has become narrower and narrowe. The above developing process without exception includes the following problems.

That is, it is desirable to make the width of a resist pattern formed after developing uniformly over the entire surface of the wafer, however, it is difficult to meet the requirement of enlarging the size of the wafer or minimizing the pattern simply by applying conventional means or equipments.

For this reason, the optimum combination including the dropping condition of the developer and the number of rotation (rotation speed) has been assessed through varying various parameters by trial and error, whereby an enormous time has been required for establishing new satisfactory conditions.

Similarly to the developing process, it can be concluded that next step of dry-etching process involves a problem that a vast developing time has been required for pattern-etching uniformly over the entire surface of the wafer.

In order to solve the above problem, if the uniformity of the on-surface pattern of the wafer can be changed partially simply by apparatus adjustment, it will be possible to grade up the on-surface uniformity of the resist in terms of its dimension, and in addition to shorten a time for evaluation and development.

The present invention has been achieved based on recognizing the above problems and findings thereafter. It is an object of the present invention to provide a resist developing process which can make the central pattern width narrower selectively (i.e., prevent widening) simply by apparatus adjustment (mechanical adjustment), in case where, otherwise under certain conditions, the pattern width of a wafer's central portion becomes wider, thereby making it possible to grade up the on-surface uniformity and improving the performance.

It is another object of the present invention to provide a resist developing process which can serve as shortening a time for evaluation and development and grading up the productivity.

Other objects of the present invention will become apparent in the entire disclosure.

In order to attain the above objects, there is provided a novel resist developing process for forming a resist pattern on a wafer for semiconductor according to the present invention. The process comprises steps of puddling (casting up) a developer on the surface of a wafer, holding the wafer inclined at a predetermined angle while the developer is being puddled and repeating stoppage and slow rotation alternately plural times.

The pattern width at the central portion of the wafer can be made narrower as compared with the case where no such process is applied. Namely, otherwise the pattern width of the central portion of the wafer becomes wider than that of the peripheral portion of the wafer. Thus an increased pattern uniformity in the width over the entire wafer surface can be achieved.

The tilt angle is set at an angle which does not allow the developer to spill over the wafer. The slow rotation is carried out at a speed which allows the developer to be retained puddled on the wafer.

The stoppage of rotation is performed during a period of time which is sufficient to allow the developer to flow toward and puddle at the lowest end portion of the inclined wafer to provide a thinner thickness of the developer at the other end portion thereof.

The alternate stoppage and slow rotation are repeated until a uniform pattern width over the entire wafer is achieved.

Alternatively, the alternate stoppage and slow rotation are repeated sufficient times to give an increased developing rate at the control portion of the wafer as compared with the peripheral portion thereof.

PREFERRED EMBODIMENTS OF THE INVENTION

Figure 1:
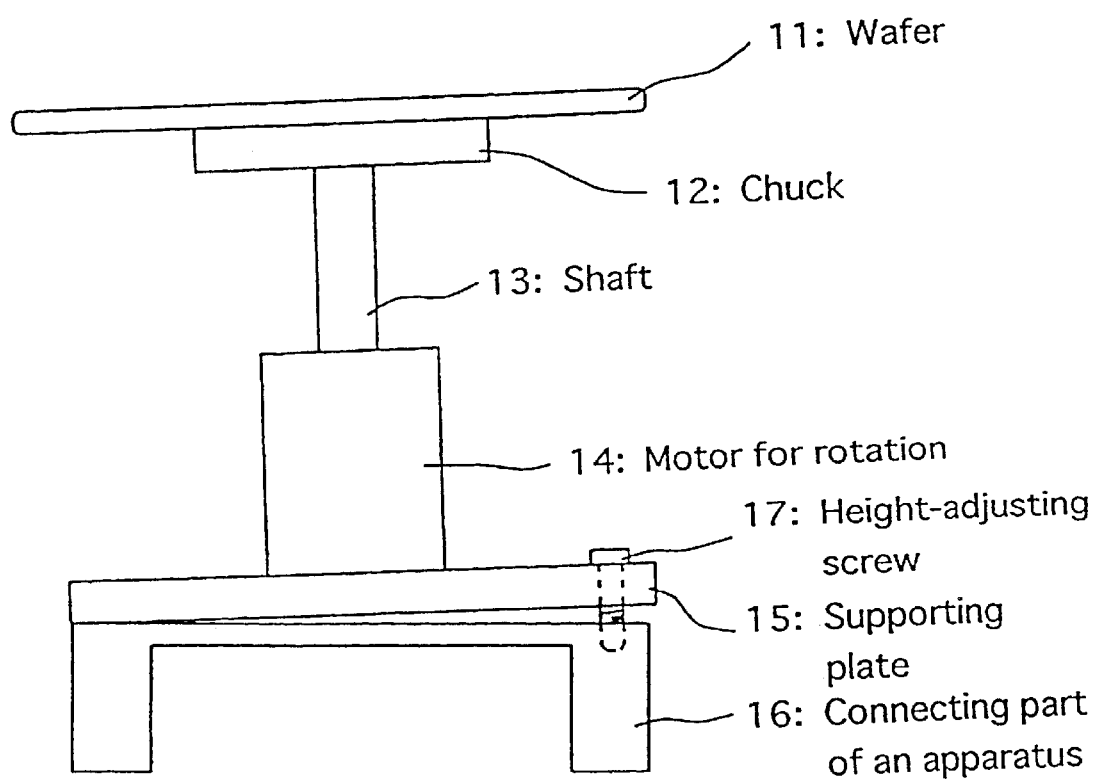
FIG. 1 is a cross-sectional view showing an example of the present invention.
Figure 8:
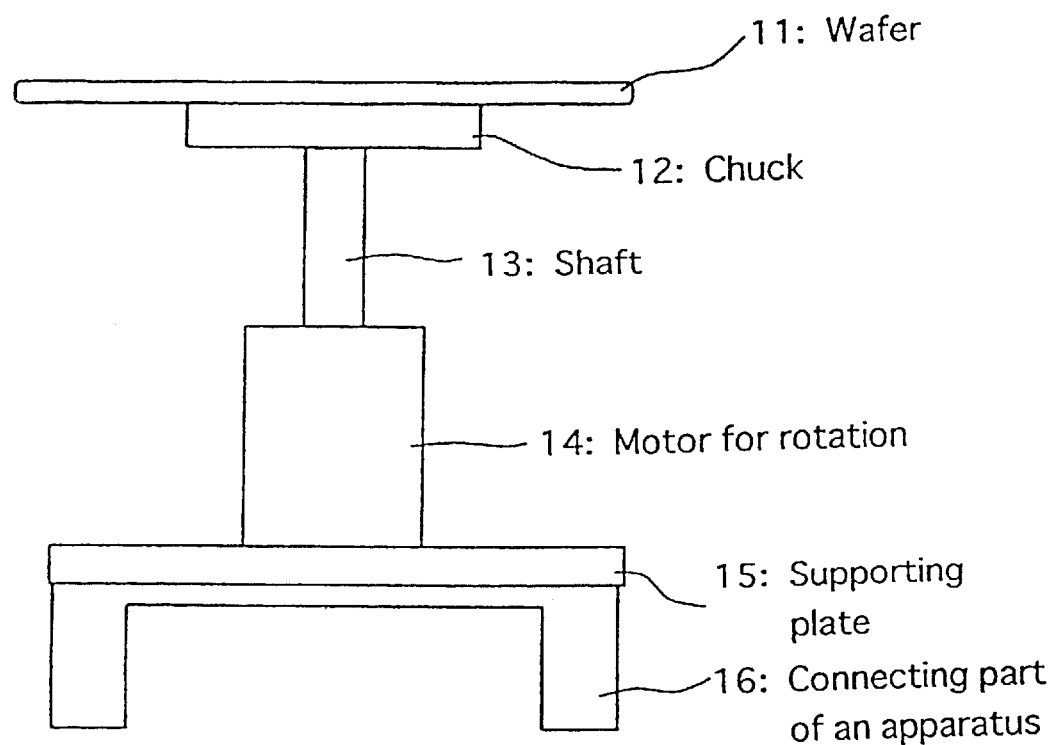
FIG. 8 is a cross-sectional view showing a conventional resist developing apparatus.

An embodiment of the present invention will be explained below. As shown in FIG. 8, a wafer 11 is normally set to be horizontal at the time of setting up an apparatus. Increasing a developing rate selectively on the central surface portion of a wafer can be made by inclining the wafer from a horizontal state at an angle which does not make a puddled liquid overflow as shown in FIG. 1, and then developing in the puddle. A height-adjusting screw 17 is usually used for adjusting the wafer horizontally in general, and it is easy to incline the wafer.

The effect of inclining the wafer is as follows: In the puddle developing process, as mentioned above, a developer is puddled on the wafer to have a liquid thickness of about 2 mm, and in the interval of 60 seconds, for example, stoppage for 9 seconds and slow 60° rotation for 1 second are repeated 6 times. During this period of time, the developer will not flow unless the wafer is inclined.

Figure 2:
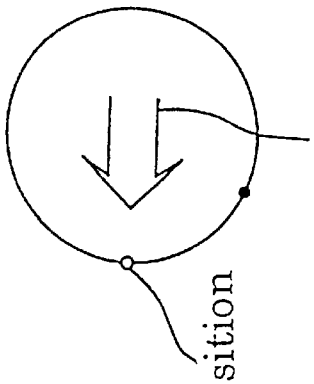
FIG. 2 is a cross-sectional and plane views for explaining the example of the present invention.
Figure 2:
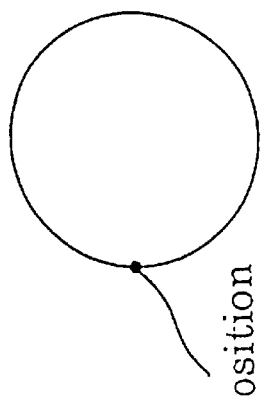
Figure 2:
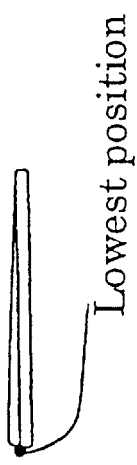
Figure 2:

However, when the wafer is inclined, the developer will flow as shown in FIGS. 2(a) and 2(c). In other words, as shown in FIG. 2(a), the developer will puddle (accumulate) at the lowest end (denoted by black circle) portion during stoppage for 9 seconds.

Next slow 60° rotation for 1 second, the lowest end moves, and as shown in FIG. 2(c), the developer will flow toward the new lowest end (denoted by the white circle) portion from the upper side thereof and return to a stable state as shown in FIG. 2(a) during the next time of stoppage for 9 seconds. Now, FIGS. 2(a) and 2(c) are cross-sectional views; and FIGS. 2(b) and 2(d), plane views.

As the result of repetition of the above procedure for six times, the developing rate increases at the central portion as compared with its peripheral portion due to the diffusion of the developer occurring at every rotation.

At the peripheral portion the liquid thickness sometimes decreases and the developing rate becomes relatively low.

Consequently, it is possible to increase the developing rate and make the pattern's dimension (non masked area) thinner selectively at the central portion.

EXAMPLE

In order to explain the above described embodiment in more detail, an example of the present invention will be explained below in reference to the accompanying drawings. FIG. 1 is a view showing the constitution of an exemplary developing apparatus of the present invention. Referring to FIG. 1, the surface, of a wafer 11 on which developing treatment is to be performed, is covered with a positive resist film and subjected to treatment with exposure by using a reduction exposure apparatus such as a stepper. In adjusting the developing apparatus used in the present invention, a chuck 12 is allowed intentionally to be inclined. Normally, by applying a height-adjusting screw used for leveling, the adjustment to existent equipments easily becomes possible.

The tilt angle corresponds to a small angle which does not cause the developer to overflow (spill) out of a wafer 11 after forming a puddle state. Usually it is difficult to measure the angle of a cross-sectional portion. Thus, for example, by placing a leveling instrument (not shown in the figure) on the chuck 12, a tilt angle can be detected from the moving distance of a bubble found in the leveling instrument. However, checking the tilt angle by way of placing the leveling instrument on the chuck 12 causes contamination of the surface of chuck 12, and consequently, contamination of the back of the wafer 11 so that the frequent checking in course of daily inspection and the like should be avoided.

Figure 3:
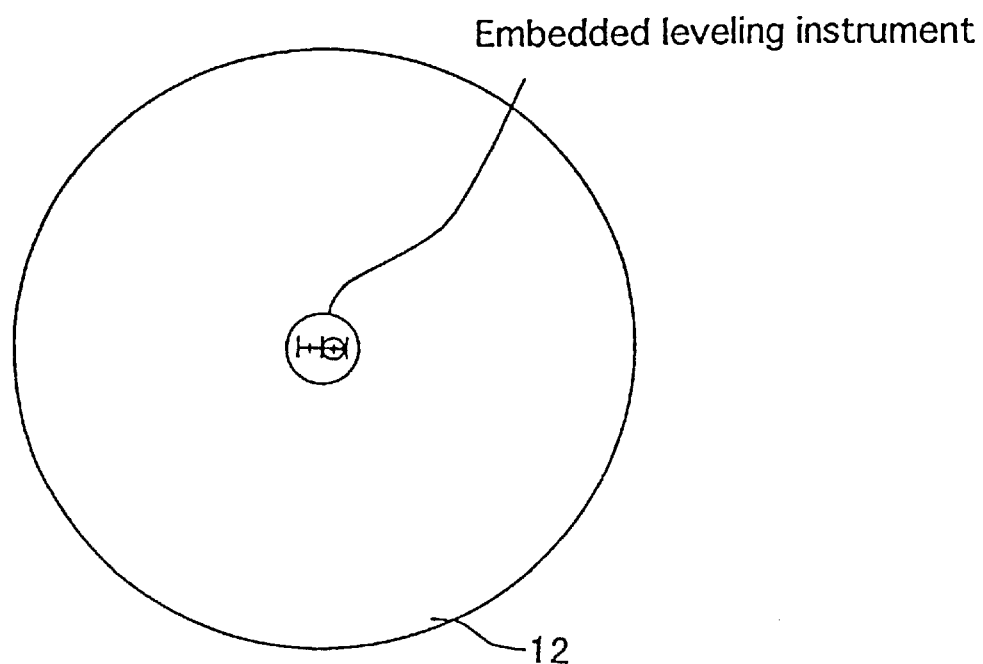
FIG. 3 is a plane view showing the constitution of a wafer chuck in the example of the present invention.
Figure 3:
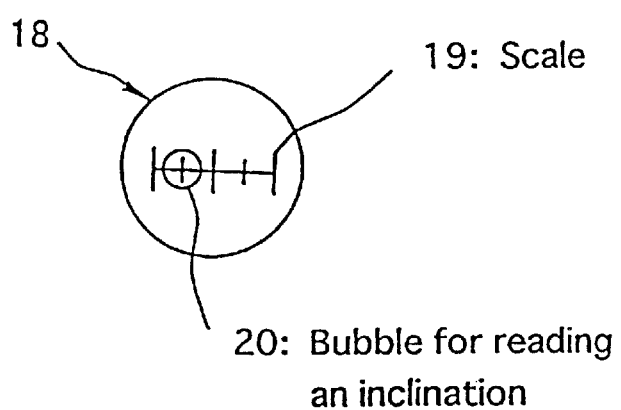

Now, in this example, as shown in FIG. 3(a), a leveling instrument 18 is embedded in the chuck 12, thereby the above problem is specifically solved. While on the chuck 12 thus reconstructed the wafer 11 is placed and developing treatment employing the puddling method is performed. FIG. 3(b) is an enlarged fragmentary view showing the leveling instrument 18 embedded in the chuck 12.

The dropping method of a developer and the number (speed) of a wafer's rotation at the time of dropping a developer is optimized so as to equalize the dimension of a pattern on the wafer's surface without generating defects upon developing. However, an enormous time has been required for these evaluation and development as mentioned beforehand.

Figure 4:
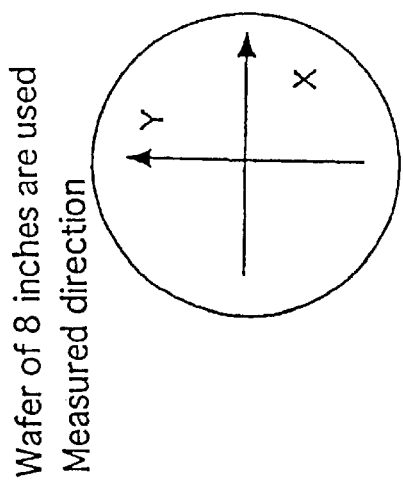
FIG. 4 is a graph showing the result of measuring the dimension of a pattern obtained by conventional developing in normal state.
Figure 4:
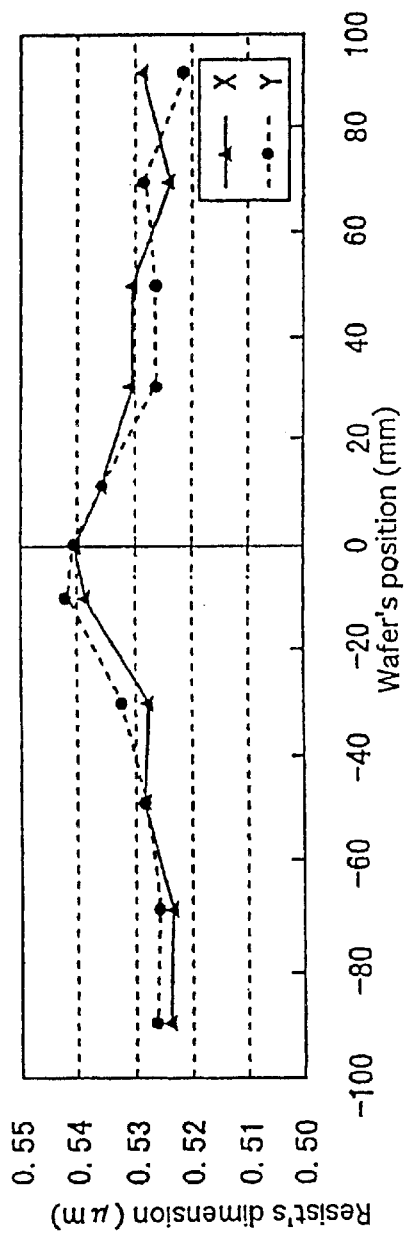

Accordingly, it is effective to apply a developing method of the present invention, when the pattern's dimension has a tendency to become wide only at the central portion of the surface as shown in FIG. 4 as a result of applying existent means in enlarging the size of a wafer or in the stage of evaluation and development.

FIG. 4 shows the result of developing by using actually a wafer of 8 inch and shower-type developing nozzle (comparative example with use of a conventional developing apparatus shown in FIG. 8). The variation range of the on-surface pattern's dimension is 0.02 $\mu$m. In FIG. 4, the abscissa represents the wafer position; and the ordinate, the resist's dimension.

Figure 5:
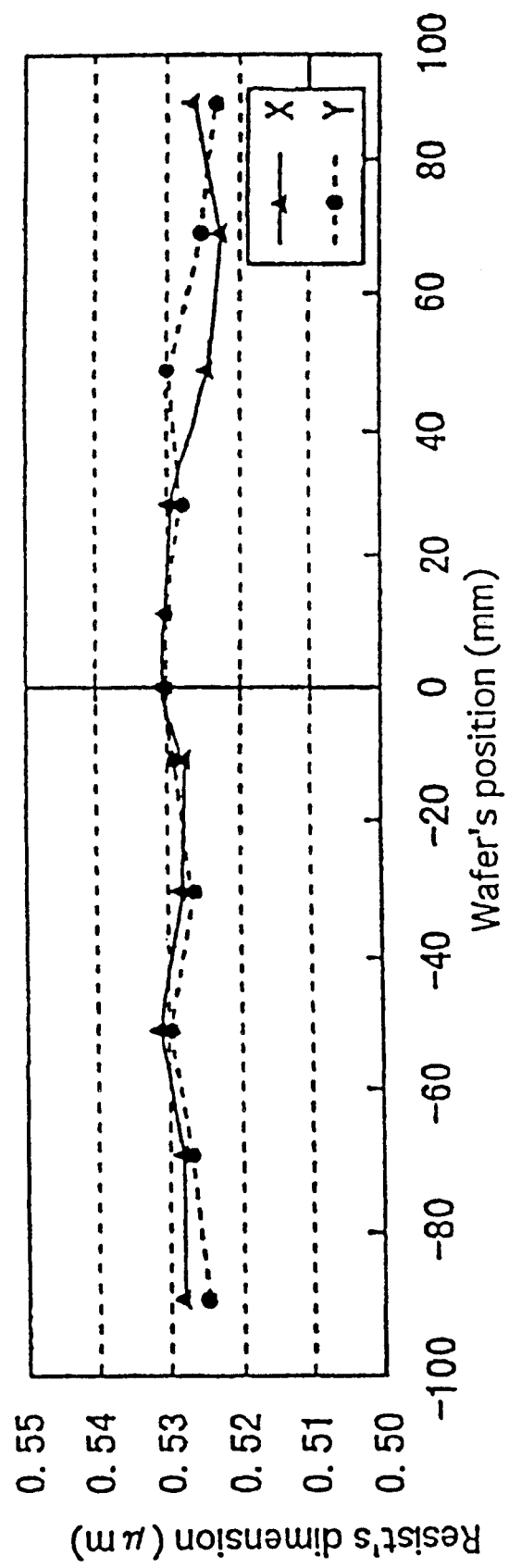
FIG. 5 is a graph showing the result of measuring the dimension of a pattern in accordance with an example of the present invention.
Figure 6:
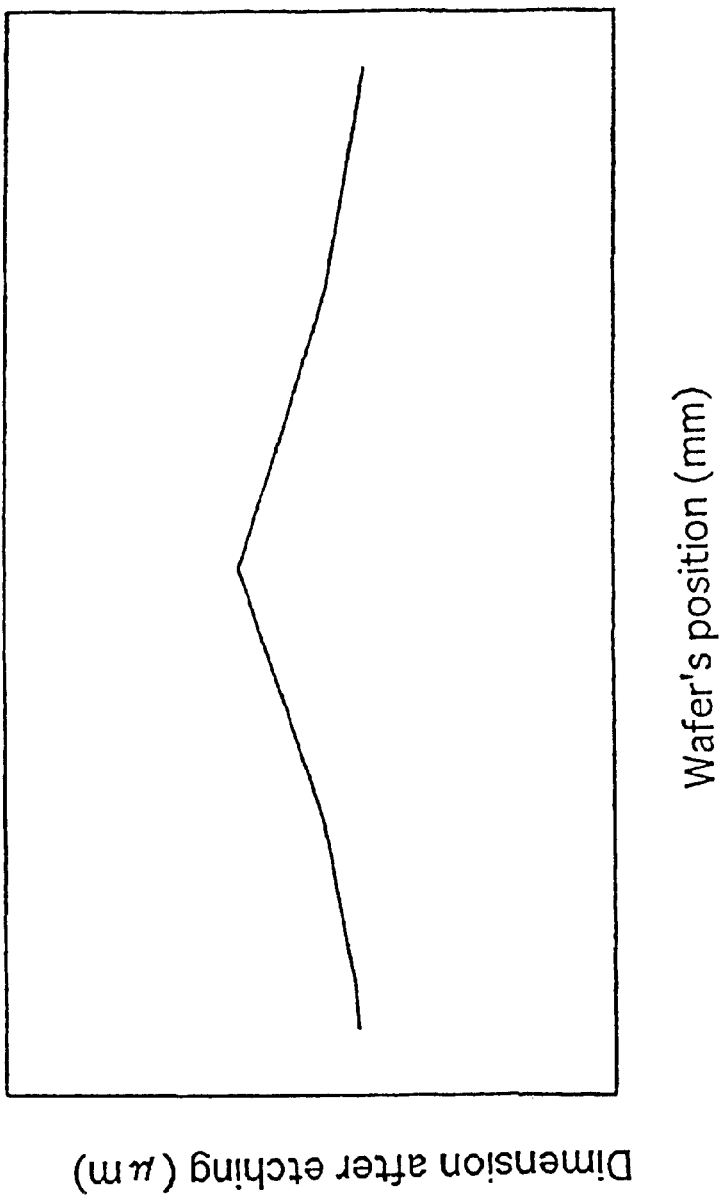
FIG. 6 is a graph showing on-surface tendency (characteristics) of a pattern's dimension after etching.
Figure 7:
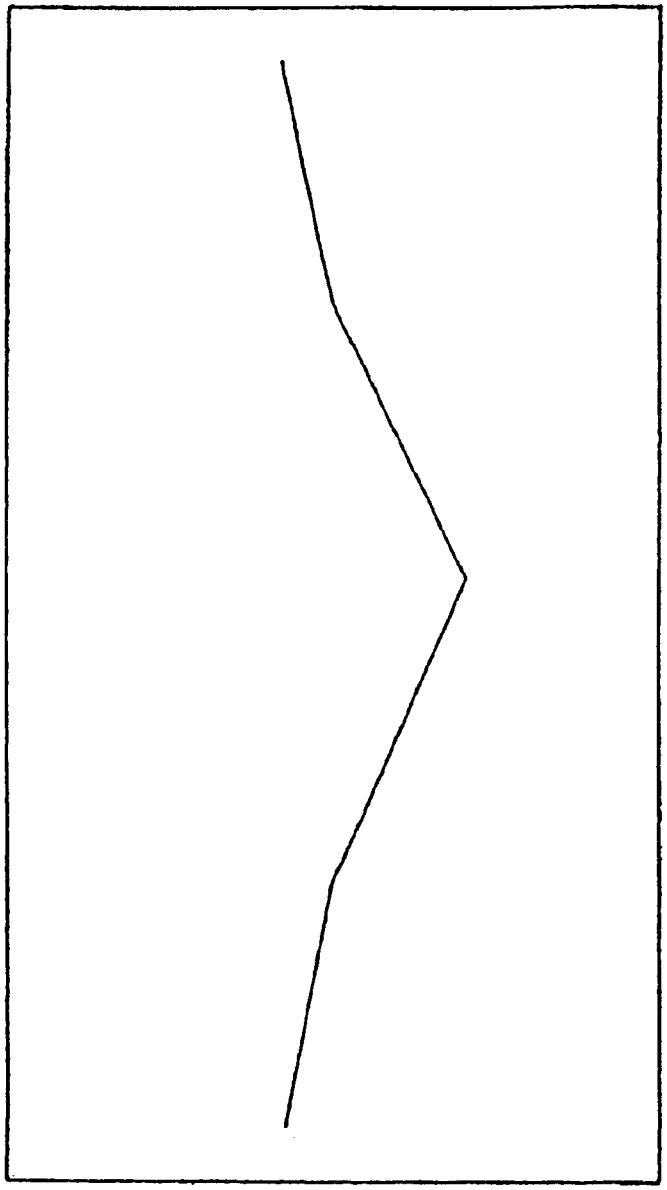
FIG. 7 is a graph showing on-surface tendency (characteristics) of a resist pattern's dimension.

In contrast thereto, the result of an example to which the present invention is applied shows the variation range of about 0.01 $\mu$m, as shown in FIG. 5, which exhibits very excellent uniformity.

The same process can be applied to a case of the combination with etching. When aluminum is etched by using, for example, electron cyclotron resonance (ECR) etching apparatus, there are some cases that the etching rate becomes high at the peripheral portion of a wafer and the dimension (resultant non-etched width) after etching becomes narrow at the peripheral portion.

In this case, the pattern's dimension on the central portion of the wafer is set narrow in the course of forming a resist pattern by applying a developing process of the present invention, which will be made possible to achieve a uniform the dimension on the surface after etching.

The meritorious effect of the present invention are summarized as follows.

As explained above, a resist developing process of the present invention includes steps of inclining a wafer and repeating slow rotation and stoppage several times, and exhibits an effect that it is made possible to thin down the dimension of a pattern selectively at the central portion of the wafer surface. In the concrete example to which the present invention is applied, the variation range of the dimension was decreased to 0.01 $\mu$m, which corresponds to a half of the conventional one.

This is based on the reason that repetition of slow rotation and stoppage in addition to the inclination of the wafer selectively promotes the developer located on the central portion of the wafer to be diffused with advantage.

Thereby a method for achieving a uniform dimension of the on-surface pattern has been provided. Moreover, concerning the dropping method of the developer and the number (speed) of the rotation, though a vast time has been spent for evaluation and development in the past, the present invention makes it possible to remarkably shorten the time required for these evaluation and development.

It should be noted that modification obvious in the art may be done without departing the gist and scope of the present invention as disclosed herein and claimed hereinbelow as appended.

What is claimed is:

1. A developing apparatus for obtaining a resist pattern on a semiconductor wafer comprising:
   a) means for supporting said wafer for rotation about a rotation axis;
   b) means for tilting the rotation axis with respect to the vertical direction
   c) means for rotating said wafer about said tilted rotation axis;
      wherein developer is puddled on said wafer and said rotating means alternately stops and rotates said wafer about said tilted rotation axis.

2. Apparatus as recited in claim 1 further including means for visual determining the tilt angle of said rotation axis.

3. Apparatus as recited in claim 1 wherein said tilting means comprises an adjusting screw.

4. Apparatus as recited in claim 1 wherein said means for rotating includes a motor for rotating said wafer at a speed sufficient to permit the developer to be retained in a puddled form on the wafer during rotation.

5. Apparatus as recited in claim 1 wherein said rotating means stops rotation of said wafer for a time sufficient to allow developer to flow toward and puddle at the lowest end portion of the inclined wafer.

6. Apparatus as recited in claim 1 wherein said rotating means is operative to repeatedly stop and rotate said wafer so as to provide a developer with a uniform width over the surface of the wafer.

7. Apparatus as recited in claim 1 wherein said means for tilting includes a leveling instrument.

8. Apparatus as recited in claim 1 wherein said supporting means includes a chuck.

9. Apparatus as recited in claim 8 wherein said means for tilting includes a leveling instrument embedded in said chuck.

* * * * *